(12) United States Patent
Liu et al.

(10) Patent No.: US 11,551,971 B2
(45) Date of Patent: Jan. 10, 2023

(54) CONTACT PLUG STRUCTURE AND MANUFACTURING METHOD THEREOF

(71) Applicant: Fujian Jinhua Integrated Circuit Co., Ltd., Quanzhou (CN)

(72) Inventors: An-Chi Liu, Tainan (TW); Yi-Wang Jhan, Taichung (TW)

(73) Assignee: Fujian Jinhua Integrated Circuit Co., Ltd., Quanzhou (CN)

( * ) Notice: Subject to any disclaimer, the term of this patent is extended or adjusted under 35 U.S.C. 154(b) by 63 days.

(21) Appl. No.: 17/235,904

(22) Filed: Apr. 20, 2021

(65) Prior Publication Data

US 2022/0020639 A1 Jan. 20, 2022

(30) Foreign Application Priority Data

Jul. 16, 2020 (CN) .......................... 202010688657.7
Jul. 16, 2020 (CN) .......................... 202021410397.9

(51) Int. Cl.
| | |
|---|---|
| *H01L 21/768* | (2006.01) |
| *H01L 29/40* | (2006.01) |
| *H01L 29/417* | (2006.01) |
| *H01L 23/522* | (2006.01) |
| *H01L 23/532* | (2006.01) |
| *H01L 21/306* | (2006.01) |

(52) U.S. Cl.
CPC .... *H01L 21/76844* (2013.01); *H01L 21/7685* (2013.01); *H01L 21/76805* (2013.01); *H01L 23/5226* (2013.01); *H01L 29/401* (2013.01); *H01L 29/41766* (2013.01); *H01L 21/30604* (2013.01); *H01L 23/53223* (2013.01); *H01L 23/53238* (2013.01); *H01L 23/53266* (2013.01)

(58) Field of Classification Search
CPC ......... H01L 21/76844; H01L 21/76805; H01L 21/7685; H01L 23/5226; H01L 29/401; H01L 29/41766; H01L 21/30604; H01L 23/53223; H01L 23/53238; H01L 23/53266; H01L 21/28518; H01L 21/76831; H01L 23/485
See application file for complete search history.

(56) References Cited

U.S. PATENT DOCUMENTS

2008/0079090 A1* 4/2008 Hwang ............ H01L 21/76889
257/E21.409

* cited by examiner

*Primary Examiner* — David Vu
(74) *Attorney, Agent, or Firm* — Winston Hsu

(57) ABSTRACT

The invention provides a contact plug structure. The contact plug structure comprises a substrate and a dielectric layer, and a first contact hole located in the dielectric layer and penetrating into the substrate, the first contact hole has a first through hole portion located in the dielectric layer and a first groove located in the substrate, and the first through hole portion is communicated with the first groove, the maximum width of the first groove is larger than that of the first through hole portion in the direction parallel to the substrate surface. A barrier layer at least partially covering the sidewall of the first groove. A conductive pad layer is located on the bottom surface of the first groove. The conductive core layer is arranged on the conductive pad layer, and the barrier layer wraps the conductive pad layer and the conductive core layer.

18 Claims, 3 Drawing Sheets

CONTACT PLUG STRUCTURE AND MANUFACTURING METHOD THEREOF

BACKGROUND OF THE INVENTION

1. Field of the Invention

The invention relates to the field of semiconductors, in particular to a contact plug structure.

2. Description of the Prior Art

In the MOS transistor manufacturing process, in order to electrically connect the gate and source/drain of the transistor to the circuit, it is usually necessary to form a contact plug for conduction. Metal conductors such as tungsten, aluminum and copper are usually used for contact plugs, but their direct conduction with polycrystalline or monocrystalline silicon materials such as gate structures and source/drain regions is not ideal.

In order to improve the Ohmi contact between the contact plug and the gate structure and the source/drain, an improvement measure in the prior art is to form a silicide at the bottom of the contact plug and the gate structure and/or the source/drain. However, before forming the contact plug, the metal silicide is usually deposited with a layer of metal Co at the bottom of the contact hole by sputtering process, and a thin layer of metal silicide is formed by heat treatment. The sputtering process and heat treatment will cause Co to diffuse laterally into the gate structure and/or source/drain, thus affecting the device performance.

SUMMARY OF THE INVENTION

The main purpose of the present invention is to provide a contact plug structure, so as to solve the problem that the device performance is easy to be lowered due to the process of the contact plug in the prior art.

The present invention provides a contact plug structure, the contact plug structure includes a substrate, a dielectric layer disposed on the substrate, and a contact plug structure disposed in the substrate and the dielectric layer, wherein the contact plug structure comprising: a first contact hole located in the dielectric layer and penetrating into the substrate, wherein the first contact hole has a first through hole portion located in the dielectric layer and a first groove located in the substrate, wherein the first through hole portion is connected with the first groove, and wherein a maximum width of the first groove is larger than a maximum width of the first through hole portion in the direction parallel to a surface of the substrate, and a dielectric barrier layer at least partially covering the sidewall of the first groove.

The present invention further provides a method for forming a contact plug structure, the method including: providing a substrate, a dielectric layer is formed on the substrate, and a first contact hole penetrating into the substrate and the dielectric layer, wherein the first contact hole has a first through hole portion located in the dielectric layer and a first groove located in the substrate, wherein the first through hole portion is connected with the first groove, and wherein a maximum width of the first groove is larger than a maximum width of the first through hole portion in the direction parallel to a surface of the substrate, and forming a dielectric barrier layer at least partially covering the sidewall of the first groove.

According to the technical scheme of the invention, a contact plug structure is provided, which comprises a substrate and a dielectric layer arranged on the substrate, wherein the contact plug structure comprises a first contact hole positioned in the dielectric layer and penetrating into the substrate, the first contact hole is provided with a first through hole portion positioned in the dielectric layer and a first groove positioned in the substrate. The maximum width of the cross section of the first groove is larger than that of the first through hole portion, and the contact plug structure further comprises a dielectric barrier layer, a conductive pad layer and a conductive core layer, wherein the dielectric barrier layer at least partially covers the side wall of the first groove and wraps the conductive pad layer and the conductive core layer. Due to the existence of the dielectric barrier layer, metal ions will not laterally diffuse into the substrate in the process of forming the conductive pad layer, thus preventing metal ions from laterally diffusing into the gate electrode and/or the source drain electrode when forming the contact plug contacting with the gate electrode and/or the source drain electrode, thereby improving the performance of the device.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

As introduced in the prior art, a metal silicide is formed at the bottom of the contact plug and the gate structure and/or source/drain to improve the Ohmi contact. However, the metal silicide is usually formed by sputtering process and heat treatment, which will cause the sputtering material to diffuse laterally into the gate structure and/or source/drain, thus affecting the device performance.

Figure 1:
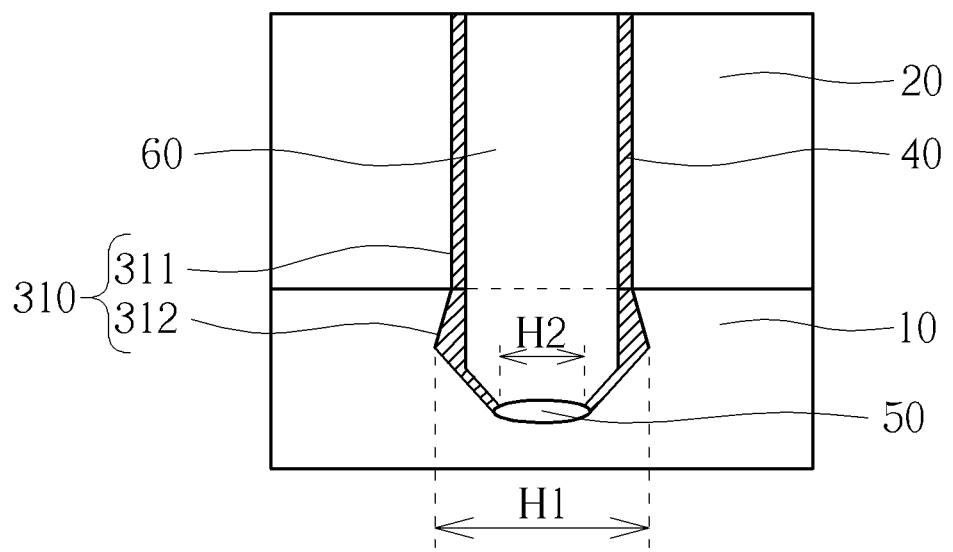
FIG. 1 shows a schematic cross-sectional structure diagram of a substrate of a contact plug structure provided by an embodiment of the present invention.

In order to solve the above technical problems, according to one aspect of the present invention, the applicant of the present invention provides a contact plug structure, as shown in FIG. 1, which comprises a substrate 10 and a dielectric layer 20 disposed on the substrate 10, and further comprises a first contact hole 310, a dielectric barrier layer 40, a conductive pad layer 50 and a conductive core layer 60, wherein the first contact hole 310 is located in the dielectric layer 20 and penetrates into the substrate 10. The first contact hole 310 also has a first through hole portion 311 located in the dielectric layer 20 and a first groove 312 located in the substrate. The first through hole portion 311 communicates with the first groove 312, and the maximum width of the first groove 312 is larger than that of the first through hole portion 311 in the direction parallel to the surface of the substrate 10. A dielectric barrier layer 40 at least partially covering the sidewall of the first groove 312. A conductive pad layer 50 located on the bottom surface of the first groove 312. The conductive core layer 60 is disposed on and contacts the conductive pad layer 50, and the dielectric barrier layer 40 wraps the conductive core layer 60 and the conductive pad layer 50.

Due to the existence of the dielectric barrier layer, metal ions will not laterally diffuse into the substrate in the process of forming the conductive pad layer, thus preventing metal ions from laterally diffusing into the gate electrode and/or the source drain electrode when forming the contact plug contacting with the gate electrode and/or the source drain electrode, thereby improving the performance of the device.

As shown in FIG. 1, the maximum width H1 of the first groove 312 is larger than the maximum width H2 of the conductive pad layer 50.

In the contact plug structure of the present invention, in the direction parallel to the surface of the substrate 10, the maximum width of the first groove 312 is larger than that of the first through-hole section 311. The above structure can make the dielectric barrier layer 40 in the first groove 312 have a larger thickness to prevent lateral diffusion of metal ions.

In an optional embodiment of the present invention, in the direction perpendicular to the surface of the substrate 10, any cross section of the first groove 312 in the first contact hole 310 may be a polygon with n sides, wherein n≥6.

In one embodiment of the present invention, in the direction perpendicular to the surface of the substrate 10, any cross section of the first groove 312 is hexagonal, and any opposite side of the hexagon is parallel, as shown in FIG. 1.

Figure 2:
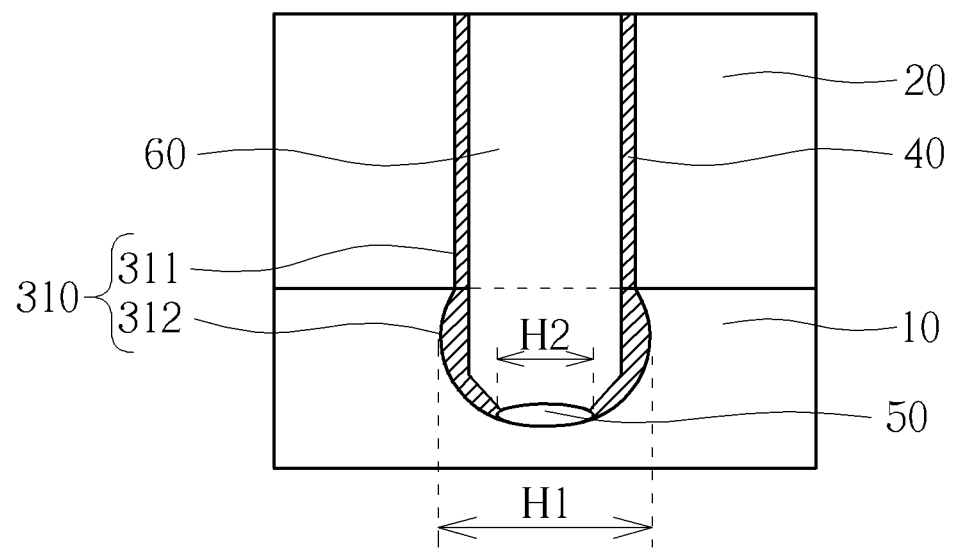
FIG. 2 is a schematic diagram showing the cross-sectional structure of the substrate of another contact plug structure provided by the embodiment of the present invention.

In another optional embodiment of the present invention, in the direction perpendicular to the surface of the substrate 10, the arbitrary cross section of the first groove 312 is a graph formed by alternately connecting two straight lines and two arc lines, and the straight line is parallel to the surface of the substrate 10, as shown in FIG. 2.

In an optional embodiment of the present invention, in the direction parallel to the surface of the substrate 10, any cross section of the first groove 312 in the first contact hole 310 may also be a polygon with n sides, where n≥6.

Figure 3:
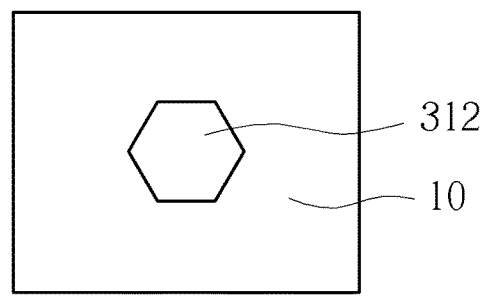
FIG. 3 shows a schematic cross-sectional structure of the first groove in the contact plug structure provided by the present invention in the direction parallel to the substrate.

In the above embodiment, preferably, in the direction parallel to the surface of the substrate 10, any cross section of the first groove 312 is hexagonal, as shown in FIG. 3.

Figure 4:
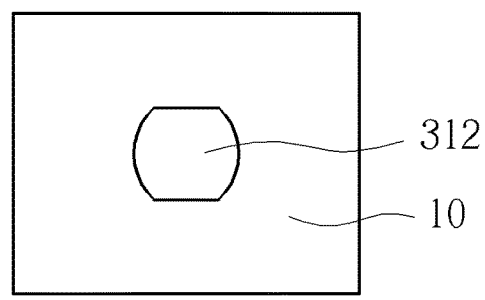
FIG. 4 shows a schematic cross-sectional structure of the first groove in another contact plug structure provided by the present invention in a direction parallel to the substrate.

In another alternative embodiment of the present invention, in the direction parallel to the surface of the substrate 10, any cross section of the first groove 312 may also be a graph formed by alternately connecting two straight lines and two arc lines, as shown in FIG. 4.

In the contact plug structure of the present invention, the dielectric barrier layer 40 may have a first barrier region covering the sidewall of the first groove 312 and a second barrier region covering the sidewall of the first through hole portion 311 for improving the barrier effect of the dielectric barrier layer 40 on expanding metal ions. Preferably, the thickness of the first barrier region is greater than that of the second barrier region.

The dielectric barrier layer 40 may be formed of a dielectric material, and in order to improve the barrier effect of the dielectric barrier layer 40, the dielectric material is selected from any one or more of titanium, titanium nitride, tantalum and tantalum oxide.

In the contact plug structure of the present invention, the conductive pad layer 50 and the conductive core layer 60 are both disposed in the first contact hole 310, and the dielectric barrier layer 40 wraps the conductive core layer 60 and the conductive pad layer 50. The conductive pad layer 50 is used to decrease contact resistance. Since the conductive pad layer 50 is usually metal silicide and is formed by sputtering metal materials such as cobalt and then heat treatment, the dielectric barrier layer 40 can prevent the sputtering of the metal materials and lateral diffusion of metal ions during heat treatment, thereby improving device performance.

Those skilled in the art can reasonably select the first conductive material forming the conductive pad layer 50 and the second conductive material forming the conductive core layer 60 according to the prior art. The first conductive material can be any one or more silicide metals such as cobalt, titanium and nickel, and the second conductive material can be selected from any one or more of tungsten, aluminum and copper, but is not limited to the above optional types.

According to another aspect of the present invention, a manufacturing method of the above-mentioned contact plug structure is provided, as shown in FIG. 5 to FIG. 8, which comprises the following steps: forming a dielectric layer 20 on the substrate 10, and forming a first contact hole 310 penetrating into the substrate 10 in the dielectric layer 20, wherein the first contact hole 310 has a first through hole portion 311 located in the dielectric layer 20 and a first groove 312 located in the substrate 10; forming a dielectric barrier layer 40 in the first contact hole 310 so that the dielectric barrier layer 40 at least partially covers the sidewall of the first groove 312, a conductive pad layer 50 and a conductive core layer 60 are sequentially formed in the first contact hole 310, so that the conductive pad layer 50 is located on the bottom surface of the first groove 312, the conductive core layer 60 is arranged on the conductive pad layer 50 in contact, and the dielectric barrier layer 40 wraps the conductive core layer 60 and the conductive pad layer 50.

In the preparation method, after forming the first contact hole, a dielectric barrier layer covering the sidewall of the first contact hole is formed, and then a conductive pad layer and a conductive core layer are sequentially formed, so that the conductive core layer is located at the bottom surface of the first contact hole, and the conductive core layer is arranged on the conductive pad layer. The dielectric barrier layer wraps the conductive core layer and the conductive pad layer. Due to the existence of the dielectric barrier layer, metal ions will not laterally diffuse into the substrate in the subsequent process of forming the conductive pad layer, so that when a contact plug contacting the gate and/or the source drain is formed, the above process can prevent metal ions from laterally diffusing into the gate and/or the source drain, thereby improving the performance of the device.

The manufacturing method of the contact plug structure according to the present invention will be described in more detail below. However, these exemplary embodiments may be embodied in many different forms, and should not be interpreted as being limited to the embodiments set forth herein. It should be understood that these embodiments are provided in order to make the disclosure of the present invention thorough and complete, and to fully convey the concept of these exemplary embodiments to those of ordinary skill in the art.

First, a dielectric layer 20 is formed on the substrate 10, and a first contact hole 310 penetrating into the substrate 10 is formed in the dielectric layer 20. The first contact hole 310 has a first through hole portion 311 in the dielectric layer 20 and a first groove 312 in the substrate 10, as shown in FIGS. 5 and 6.

The material of the substrate 10 can be single crystal silicon (Si), single crystal germanium (Ge), silicon germanium (GeSi) or silicon carbide (SiC), silicon on insulator (SOI), germanium on insulator (OI) or it can be other materials, such as III-V compounds such as gallium silicide.

Figure 5:
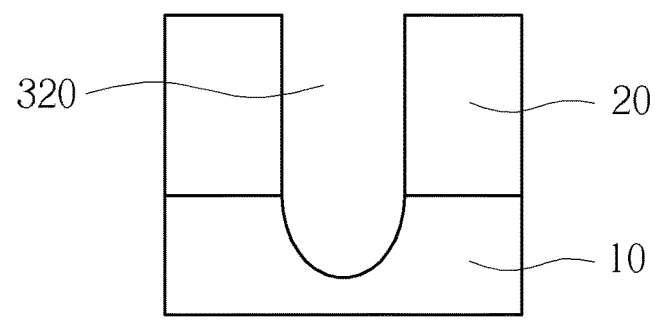
FIG. 5 is a schematic diagram showing the cross-sectional structure of the substrate after forming a dielectric layer on the substrate and forming a first contact hole penetrating into the substrate in the dielectric layer in the method for preparing the magnetic tunnel junction provided by the embodiment of the present invention.
Figure 6:
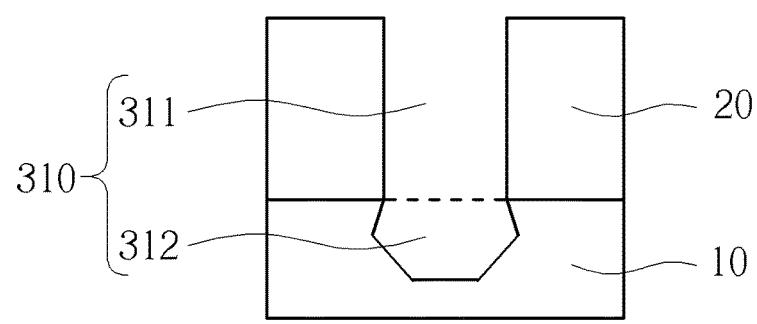
FIG. 6 shows a schematic cross-sectional structure of the substrate after the first contact hole shown in FIG. 5 is laterally expanded to form a first groove.

In a preferred embodiment, the step of forming the first contact hole 310 includes: sequentially dry etching the dielectric layer 20 and the substrate 10 to form a first through hole 320 penetrating into the substrate 10, as shown in FIG. 5. The substrate 10 corresponding to the first through hole 320 is wet etched to laterally expand the portion of the first through hole 320 in the substrate 10 to form a first groove 312, as shown in FIG. 6.

In an optional embodiment, the etching solution used in the above wet etching is tetramethylammonium hydroxide (TMAH). It should be noted that the process of forming the first contact hole 310 is not limited to the combination of dry etching and wet etching, but can also be realized by multiple dry etching or multiple wet etching.

Any cross section of the first contact hole 310 parallel to the substrate 10 may be circular, elliptical, rectangular or irregular. The dielectric layer 20 can be formed by chemical vapor deposition (CVD) or physical vapor deposition (PVD), and the material of the dielectric layer 20 can be nitride or oxide, such as silicon dioxide ($SiO_2$) or silicon nitride (SiN).

Figure 7:
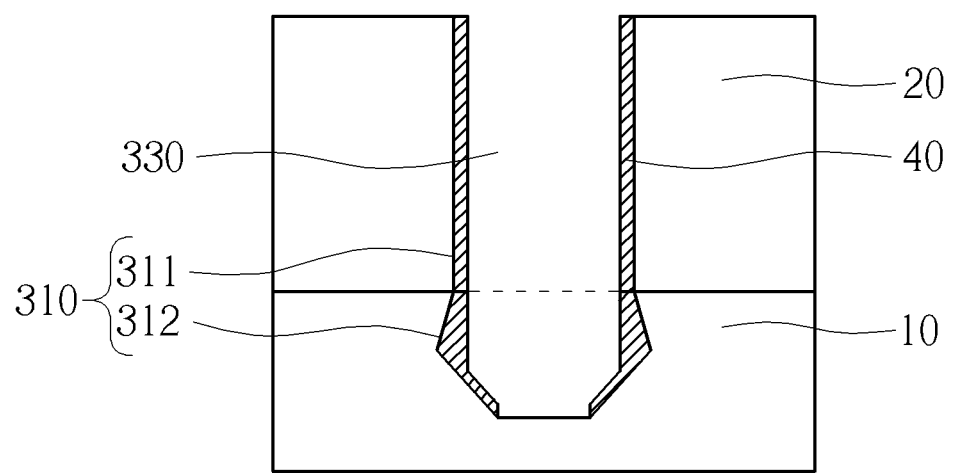
FIG. 7 shows a schematic cross-sectional structure of the substrate after forming a dielectric barrier layer in the first contact hole shown in FIG. 6.

After the step of forming the first contact hole 310, a dielectric barrier layer 40 is formed in the first contact hole 310 so that the dielectric barrier layer 40 at least partially covers the sidewall of the first groove 312 in the substrate 10, as shown in FIG. 7.

In a preferred embodiment, the step of forming the dielectric barrier layer 40 includes filling the first contact hole 310 with a dielectric material, etching the dielectric material to form a second contact hole 330 penetrating to the bottom surface of the first contact hole 310, and the remaining dielectric material constitutes a dielectric barrier layer 40, which can have a first barrier region covering the sidewall of the first groove 312 and a second barrier region covering the sidewall of the first through hole portion 311.

In the above preferred embodiment, a person skilled in the art can form the dielectric barrier layer 40 by a conventional etching process in the prior art, such as plasma etching. In order to improve the barrier effect of the dielectric barrier layer 40, the dielectric material is selected from any one or more of titanium, titanium nitride, tantalum and tantalum oxide.

Figure 8:
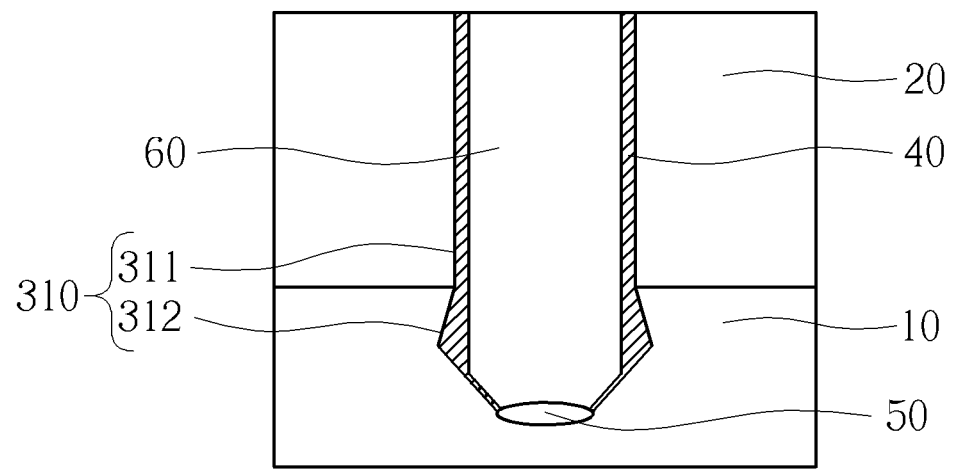
FIG. 8 shows a schematic cross-sectional structure of the substrate after sequentially forming a conductive pad layer and a conductive core layer in the first contact hole shown in FIG. 7.

After the step of forming the dielectric barrier layer 40, a conductive pad layer 50 and a conductive core layer 60 are sequentially formed in the first contact hole 310, so that the conductive pad layer 50 is located on the bottom surface of the first groove 312, the conductive core layer 60 is disposed on and directly contacts the conductive pad layer 50, and the dielectric barrier layer 40 wraps the conductive pad layer 50 and the conductive core layer 60 as shown in FIG. 8.

In a preferred embodiment, the step of forming the conductive pad layer 50 includes: coating the bottom surface of the second contact hole 330 with a first conductive material by sputtering, and the first conductive material is subjected to heat treatment to form a conductive pad layer 50.

In the above preferred embodiment, the conductive pad layer 50 usually comprises a metal silicide layer formed by sputtering metal materials such as cobalt and then heat treatment, and the dielectric barrier layer 40 can prevent the metal ions from diffusing laterally during the sputtering and heat treatment of the metal materials, thereby improving the device performance. The unreacted first conductive material in the second contact hole 330 is optionally removed after the above-described step of forming the conductive pad layer 50 by heat treatment.

In the present invention, a contact plug structure is provided, the contact plug structure includes a substrate (10), a dielectric layer (20) disposed on the substrate (10), and a contact plug structure disposed in the substrate and the dielectric layer, wherein the contact plug structure comprising a first contact hole (310) located in the dielectric layer (20) and penetrating into the substrate (10), wherein the first contact hole (310) has a first through hole portion (311) located in the dielectric layer (20) and a first groove (312) located in the substrate (10), wherein the first through hole portion (311) is connected with the first groove (312), and wherein a maximum width of the first groove (312) is larger than a maximum width of the first through hole portion (311) in the direction parallel to a surface of the substrate (10), and a dielectric barrier layer (40) at least partially covering the sidewall of the first groove (312).

In some embodiment of the present invention, the cross portion profile of the first groove (312) is a polygon with n sides, and wherein n≥6.

In some embodiment of the present invention, a cross portion profile of the first groove (312) comprises two straight lines and two arc lines.

In some embodiment of the present invention, the dielectric barrier layer (40) has a first barrier region covering the sidewall of the first groove (312) and a second barrier region covering the sidewall of the first through hole portion (311).

In some embodiment of the present invention, a thickness of the first barrier region is greater than a thickness of the second barrier region.

In some embodiment of the present invention, further comprising a conductive pad layer (50) located on the bottom surface of the first groove (312).

In some embodiment of the present invention, further comprising a conductive core layer (60) contacting the conductive pad layer (50), and wherein the dielectric barrier layer (40) wraps the conductive core layer (60) and the conductive pad layer (50).

In some embodiment of the present invention, a width of the conductive pad layer (50) is smaller than a width of the maximum width of the first groove (312).

In some embodiment of the present invention, a width of the conductive pad layer is smaller than a width of the maximum width of the first through hole portion.

In some embodiment of the present invention, a top surface of the conductive pad layer is lower than a top surface of the substrate.

In some embodiment of the present invention, the conductive pad layer contacts the dielectric barrier layer directly.

In the present invention, a method for forming a contact plug structure is provided, the method including: providing a substrate, a dielectric layer (20) is formed on the substrate (10), and a first contact hole (310) penetrating into the substrate and the dielectric layer (20), wherein the first contact hole (310) has a first through hole portion (311) located in the dielectric layer (20) and a first groove (312) located in the substrate (10), wherein the first through hole portion (311) is connected with the first groove (312), and wherein a maximum width of the first groove (312) is larger than a maximum width of the first through hole portion (311) in the direction parallel to a surface of the substrate (10), and forming a dielectric barrier layer (40) at least partially covering the sidewall of the first groove (312).

In some embodiment of the present invention, the step of forming the dielectric barrier layer (40) comprising: filling a dielectric material in the first contact hole (310), etching the dielectric material to remove parts of the dielectric material in the first contact hole, and the remaining dielectric material constitutes the dielectric barrier layer (40).

In some embodiment of the present invention, further comprising forming a conductive pad layer (50) and a conductive core layer (60) sequentially in the first contact hole, wherein the dielectric barrier layer (40) wraps the conductive core layer (60) and the conductive pad layer (50).

In some embodiment of the present invention, the step of forming the conductive pad layer (50) comprising: coating a first conductive material on a bottom surface of the first groove (312) by a sputtering process, and performing a heat treatment on the first conductive material to form the conductive pad layer (50).

In some embodiment of the present invention, a width of the conductive pad layer (50) is smaller than a width of the maximum width of the first groove (312).

In some embodiment of the present invention, the step of forming the first contact hole (310) comprising: performing a dry etching step on the dielectric layer (20) and the substrate (10) sequentially to form the first through hole portion (311) penetrating into the substrate (10), performing a wet etching step on the substrate (10) to laterally expand a portion of the substrate (10) and to form the first groove (312).

In some embodiment of the present invention, the etching solution used in the wet etching step is TMAH.

From the above description, it can be seen that the above embodiments of the present invention achieve the following technical advantage:

Due to the existence of the dielectric barrier layer, metal ions will not laterally diffuse into the substrate in the process of forming the conductive underlayer, so that when a contact plug contacting the gate and/or the source and drain is formed, the above process can prevent metal ions from laterally diffusing into the gate and/or the source and drain, thereby improving the performance of the device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A contact plug structure, comprising:
   a substrate, a dielectric layer disposed on the substrate, and a contact plug structure disposed in the substrate and the dielectric layer, wherein the contact plug structure comprising:
   a first contact hole located in the dielectric layer and penetrating into the substrate, wherein the first contact hole has a first through hole portion located in the dielectric layer and a first groove located in the substrate, wherein the first through hole portion is connected with the first groove, and wherein a maximum width of the first groove is larger than a maximum width of the first through hole portion in the direction parallel to a surface of the substrate; and
   a dielectric barrier layer at least partially covering the sidewall of the first groove.

2. The contact plug structure according to claim 1, wherein the cross portion profile of the first groove is a polygon with n sides, and wherein n≥6.

3. The contact plug structure according to claim 1, wherein a cross portion profile of the first groove comprises two straight lines and two arc lines.

4. The contact plug structure according to claim 1, wherein the dielectric barrier layer has a first barrier region covering the sidewall of the first groove and a second barrier region covering the sidewall of the first through hole portion.

5. The contact plug structure according to claim 4, wherein a thickness of the first barrier region is greater than a thickness of the second barrier region.

6. The contact plug structure according to claim 1, further comprising a conductive pad layer located on the bottom surface of the first groove.

7. The contact plug structure according to claim 6, further comprising a conductive core layer contacting the conductive pad layer, and wherein the dielectric barrier layer wraps the conductive core layer and the conductive pad layer.

8. The contact plug structure according to claim 7, wherein a width of the conductive pad layer is smaller than a width of the maximum width of the first groove.

9. The contact plug structure according to claim 7, wherein a width of the conductive pad layer is smaller than a width of the maximum width of the first through hole portion.

10. The contact plug structure according to claim 7, wherein a top surface of the conductive pad layer is lower than a top surface of the substrate.

11. The contact plug structure according to claim 7, wherein the conductive pad layer contacts the dielectric barrier layer directly.

12. A method for forming a contact plug structure, comprising:

providing a substrate, a dielectric layer is formed on the substrate, and a first contact hole penetrating into the substrate and the dielectric layer, wherein the first contact hole has a first through hole portion located in the dielectric layer and a first groove located in the substrate, wherein the first through hole portion is connected with the first groove, and wherein a maximum width of the first groove is larger than a maximum width of the first through hole portion in the direction parallel to a surface of the substrate; and forming a dielectric barrier layer at least partially covering the sidewall of the first groove.

13. The method according to claim 12, wherein the step of forming the dielectric barrier layer comprising:

filling a dielectric material in the first contact hole;

etching the dielectric material to remove parts of the dielectric material in the first contact hole, and the remaining dielectric material constitutes the dielectric barrier layer.

14. The method according to claim 12, further comprising forming a conductive pad layer and a conductive core layer sequentially in the first contact hole, wherein the dielectric barrier layer wraps the conductive core layer and the conductive pad layer.

15. The method according to claim 14, wherein the step of forming the conductive pad layer comprising:

coating a first conductive material on a bottom surface of the first groove by a sputtering process; and performing a heat treatment on the first conductive material to form the conductive pad layer.

16. The method according to claim 15, wherein a width of the conductive pad layer is smaller than a width of the maximum width of the first groove.

17. The method according to claim 12, wherein the step of forming the first contact hole comprising:

performing a dry etching step on the dielectric layer and the substrate sequentially to form the first through hole portion penetrating into the substrate;

performing a wet etching step on the substrate to laterally expand a portion of the substrate and to form the first groove.

18. The method according to claim 17, wherein the etching solution used in the wet etching step is TMAH.

* * * * *